(12) United States Patent
Horiguchi et al.

(10) Patent No.: US 11,355,477 B2
(45) Date of Patent: Jun. 7, 2022

(54) POWER SEMICONDUCTOR MODULE AND POWER CONVERSION DEVICE

(71) Applicant: Mitsubishi Electric Corporation, Chiyoda-ku (JP)

(72) Inventors: Takeshi Horiguchi, Chiyoda-ku (JP); Yuji Miyazaki, Chiyoda-ku (JP); Tatsunori Yanagimoto, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 416 days.

(21) Appl. No.: 16/479,839

(22) PCT Filed: Feb. 2, 2018

(86) PCT No.: PCT/JP2018/003658
§ 371 (c)(1),
(2) Date: Jul. 22, 2019

(87) PCT Pub. No.: WO2018/143429
PCT Pub. Date: Aug. 9, 2018

(65) Prior Publication Data
US 2020/0286864 A1  Sep. 10, 2020

(30) Foreign Application Priority Data
Feb. 6, 2017  (JP) ............... JP2017-019206

(51) Int. Cl.
*H01L 25/07* (2006.01)
*H01G 2/06* (2006.01)
(Continued)

(52) U.S. Cl.
CPC ............ *H01L 25/07* (2013.01); *H01G 2/065* (2013.01); *H01G 4/40* (2013.01); *H01L 24/48* (2013.01);
(Continued)

(58) Field of Classification Search
CPC .......... H01L 25/07; H01L 2224/48227; H01L 2224/48091; H01L 2224/48137;
(Continued)

(56) References Cited

U.S. PATENT DOCUMENTS

2013/0277800 A1   10/2013   Hori et al.
2015/0155276 A1 *  6/2015   Takao ............... H02M 7/003
                                              257/140

FOREIGN PATENT DOCUMENTS

JP    3-88305 A    4/1991
JP    9-135155 A   5/1997
(Continued)

OTHER PUBLICATIONS

International Search Report dated Apr. 17, 2018 in PCT/JP2018/003658 filed Feb. 2, 2018.
(Continued)

*Primary Examiner* — Jasmine J Clark
(74) *Attorney, Agent, or Firm* — Xsensus LLP

(57) ABSTRACT

There are provided a small-sized power semiconductor module and a small-sized power conversion device capable of reducing ringing voltage. A power semiconductor module includes: a positive electrode-side switching element and a positive electrode-side freewheeling diode corresponding to a positive electrode-side power semiconductor element; a negative electrode-side switching element and a negative electrode-side freewheeling diode corresponding to a negative electrode-side power semiconductor element; a positive electrode conductor pattern; a negative electrode conductor pattern; an AC electrode pattern; and a snubber substrate including an insulating substrate having a snubber circuit formed thereon. The snubber substrate includes the insulating substrate and the at least one snubber circuit arranged on the insulating substrate. The snubber substrate is arranged on at least one of the positive electrode conductor pattern, the
(Continued)

negative electrode conductor pattern and the AC electrode pattern.

14 Claims, 8 Drawing Sheets

(51) Int. Cl.
*H01G 4/40* (2006.01)
*H01L 23/00* (2006.01)
*H01L 25/18* (2006.01)
*H02M 7/48* (2007.01)

(52) U.S. Cl.
CPC ............... *H01L 25/18* (2013.01); *H02M 7/48* (2013.01); *H01L 2224/291* (2013.01); *H01L 2224/4847* (2013.01); *H01L 2224/48091* (2013.01); *H01L 2924/1304* (2013.01); *H01L 2924/19107* (2013.01)

(58) Field of Classification Search
CPC ....................... H01L 24/48; H01L 25/16; H01L 2225/48137; H01L 25/18; H01L 24/49; H01L 2924/19107; H01L 2924/1304; H02M 7/48; H02M 7/003; H02M 1/34; H01G 2/065

See application file for complete search history.

(56) References Cited

FOREIGN PATENT DOCUMENTS

| JP | 2009-225612 A | 10/2009 |
| JP | 2012-210153 A | 10/2012 |
| JP | 2013-222950 A | 10/2013 |
| JP | 2014-53516 A | 3/2014 |
| JP | 2014-204006 A | 10/2014 |

OTHER PUBLICATIONS

Japanese Office Action dated Oct. 25, 2018 in Japanese Patent Application No. 2018-541713 (with unedited computer-generated English translation), 13 pages.

* cited by examiner

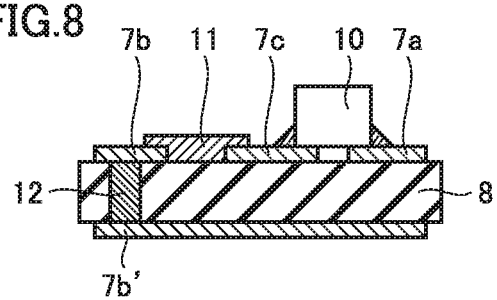
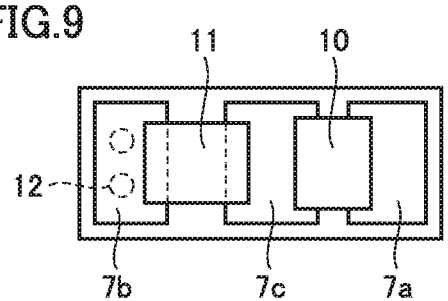
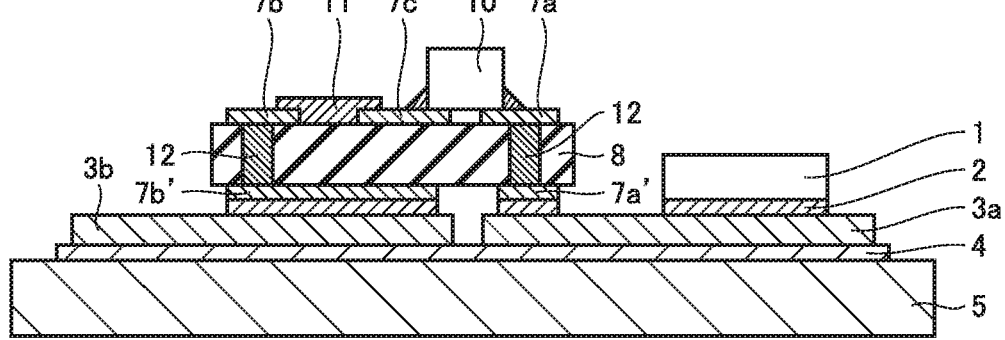

POWER SEMICONDUCTOR MODULE AND POWER CONVERSION DEVICE

TECHNICAL FIELD

The present invention relates to a power semiconductor module and a power conversion device, and particularly to a power semiconductor module and a power conversion device including means for reducing ringing voltage that occurs during switching operation.

BACKGROUND ART

The mainstream of a conventional power semiconductor module forming a power conversion device is an IGBT (Insulated Gate Bipolar Transistor) module. In such an IGBT module, an IGBT made of silicon (Si) is used as a switching element and a pin diode is used as a freewheeling diode.

In recent years, a wide bandgap semiconductor having a bandgap wider than that of Si has attracted a great deal of attention. For example, a power semiconductor module using silicon carbide (SiC) as a wide bandgap semiconductor has been developed. In the following description, SiC is used as a wide bandgap semiconductor by way of example. Since the breakdown voltage of SiC is about ten times as high as that of Si, the thickness of a drift layer in a switching element such as an IGBT can be reduced to about one-tenth of the thickness of a drift layer in the case of using Si. Therefore, a lower saturation voltage of the switching element can be achieved. In addition, the switching element using SiC can operate at high temperature. Therefore, by using SiC as a material of a power semiconductor element, a power conversion device can be further reduced in size and enhanced in efficiency, as compared with the conventional IGBT module.

When SiC is used as a material of a power semiconductor element, a MOSFET (Metal-Oxide-Semiconductor Field Effect Transistor) can be applied as a switching element and a schottky-barrier diode (hereinafter, SBD) can be applied as a freewheeling diode. As a power semiconductor module in which a device using SiC as a semiconductor material as described above (hereinafter, also referred to as "SiC device") is applied, a hybrid module has been developed. The hybrid module is such that an IGBT using Si as a semiconductor material (hereinafter, also referred to as "Si-IGBT") is still used as a switching element and an SBD using SiC as a semiconductor material (hereinafter, also referred to as "SiC-SBD") is instead used as a freewheeling diode. Thereafter, a full SiC module in which an MOSFET using SiC (hereinafter, also referred to as "SiC-MOSFET") is used as a switching element and SiC-SBD is used as a freewheeling diode is under development. Currently, a power semiconductor module in which a SiC device is applied achieves widespread use steadily.

It is known that there arises a phenomenon called "ringing" caused by LC resonance based on a parasitic capacitance (C) in an element such as a freewheeling diode forming a power semiconductor module and a parasitic inductance (L) in a wiring of the power semiconductor module. This ringing voltage occurs during a switching operation in, for example, a power semiconductor module in which SiC-SBD is used as a freewheeling diode.

When a peak value of such ringing voltage exceeds a rated voltage of a power semiconductor module, the power semiconductor module may be broken. In addition, ringing voltage may cause noise, and thus, it is necessary to reduce ringing voltage as much as possible. Particularly, for a switching element in which a wide bandgap semiconductor represented by SiC-MOSFET is used, reduction of ringing voltage is an important task in order to maximize the characteristic of being able to perform the high-speed switching operation.

One means for reducing ringing voltage is to apply a snubber circuit. For example, a conventional power semiconductor module disclosed in Japanese Patent Laying-Open No. 2013-222950 (PTL 1) has a snubber capacitor built thereinto as means for reducing ringing voltage. In addition, in a power semiconductor module disclosed in Japanese Patent Laying-Open No. 9-135155 (PTL 2), a snubber circuit is formed of a capacitor, a resistor and a diode, and the resistor and the diode are mounted in the power semiconductor module as a sub substrate.

CITATION LIST

Patent Literature

PTL 1: Japanese Patent Laying-Open No. 2013-222950
PTL 2: Japanese Patent Laying-Open No. 9-135155

SUMMARY OF INVENTION

Technical Problem

According to the power semiconductor module in PTL 1, a snubber circuit is formed only of a capacitor and does not include a resistor. When the snubber circuit does not include a resistor as a component as described above, the effect of reducing voltage oscillation is not obtained, although a peak of a ringing voltage can be reduced. In addition, the power semiconductor module in PTL 2 is configured such that the snubber circuit, so-called non-charge-type RCD snubber circuit, formed of the resistor, the capacitor and the diode is mounted as a sub substrate for each switching element. In this configuration, the number of components forming the snubber circuit is large, and thus, area for mounting these components in the power semiconductor module is large. As a result, it is difficult to reduce the size of a power conversion device.

The present invention has been made to solve the above-described problem, and an object of the present invention is to provide a small-sized power semiconductor module and a small-sized power conversion device capable of reducing ringing voltage that occurs during a switching operation of a switching element.

Solution to Problem

A power semiconductor module according to the present disclosure includes: at least one positive electrode-side power semiconductor element; at least one negative electrode-side power semiconductor element; a positive electrode conductor pattern; a negative electrode conductor pattern; an AC electrode pattern; and a snubber substrate. The positive electrode conductor pattern has the at least one positive electrode-side power semiconductor element mounted thereon. The negative electrode conductor pattern is connected to a negative electrode of the at least one negative electrode-side power semiconductor element. The AC electrode pattern has the at least one negative electrode-side power semiconductor element mounted thereon, and is connected to a negative electrode of the at least one positive electrode-side power semiconductor element. The snubber substrate includes: an insulating substrate; and at least one snubber circuit arranged on the insulating substrate. The snubber substrate is arranged on at least one of the positive electrode conductor pattern, the negative electrode conductor pattern and the AC electrode pattern. The at least one snubber circuit is connected to the positive electrode conductor pattern and the negative electrode conductor pattern.

A power conversion device according to the present disclosure includes: a main conversion circuit; and a control circuit. The main conversion circuit includes the above-described power semiconductor module and is configured to convert input electric power and output the converted electric power. The control circuit is configured to output a control signal for controlling the main conversion circuit to the main conversion circuit.

Advantageous Effects of Invention

According to the foregoing, the snubber substrate is arranged to overlap with at least one of the positive electrode conductor pattern, the negative electrode conductor pattern and the AC electrode pattern. Therefore, a parasitic inductance of a wiring can be reduced and ringing voltage can be effectively reduced by the snubber circuit, and the power semiconductor module and the power conversion device can be reduced in size, as compared with the case in which the snubber substrate is arranged planarly side by side with the positive electrode conductor pattern and the negative electrode conductor pattern.

BRIEF DESCRIPTION OF DRAWINGS

FIG. 8 is a schematic view showing a cross-sectional structure of a snubber substrate of the power semiconductor module according to the second embodiment of the present invention.

FIG. 9 is a schematic view showing a planar structure of the snubber substrate of the power semiconductor module according to the second embodiment of the present invention.

FIG. 10 is a schematic view showing a cross-sectional structure of a power semiconductor module according to a third embodiment of the present invention.

DESCRIPTION OF EMBODIMENTS

Figure 1:
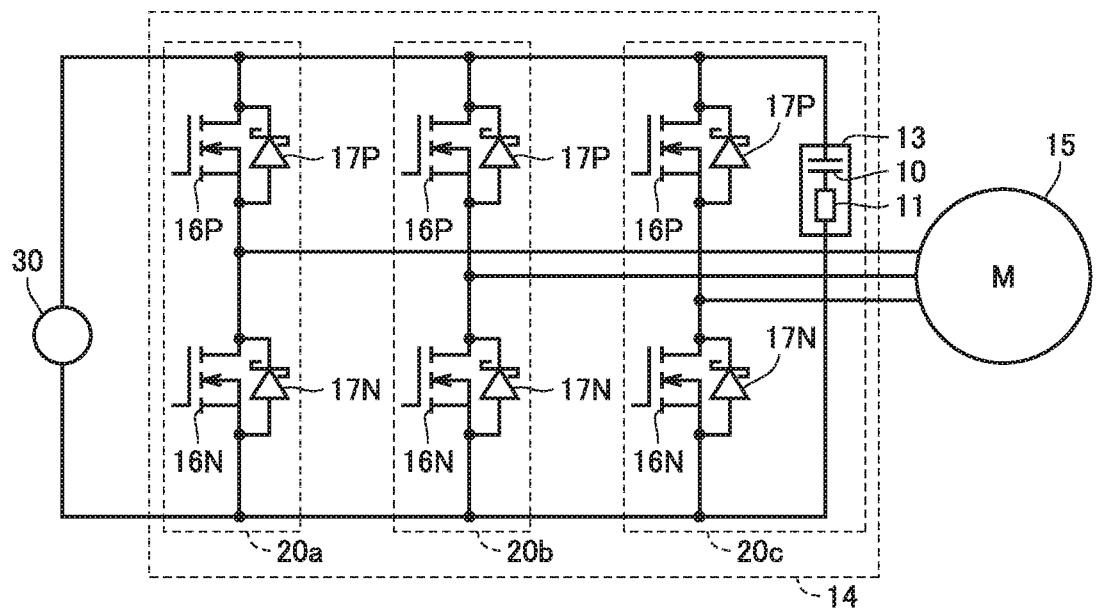
FIG. 1 is a schematic view showing a power conversion circuit in a power conversion device according to a first embodiment of the present invention.

Embodiments of the present invention will be described in detail hereinafter with reference to the drawings. While a plurality of embodiments will be described hereinafter, it is originally intended to combine the features described in the embodiments as appropriate. The same or corresponding portions in the drawings are denoted by the same reference characters and description thereof will not be repeated.

First Embodiment

<Configuration of Power Semiconductor Module>

Figure 2:
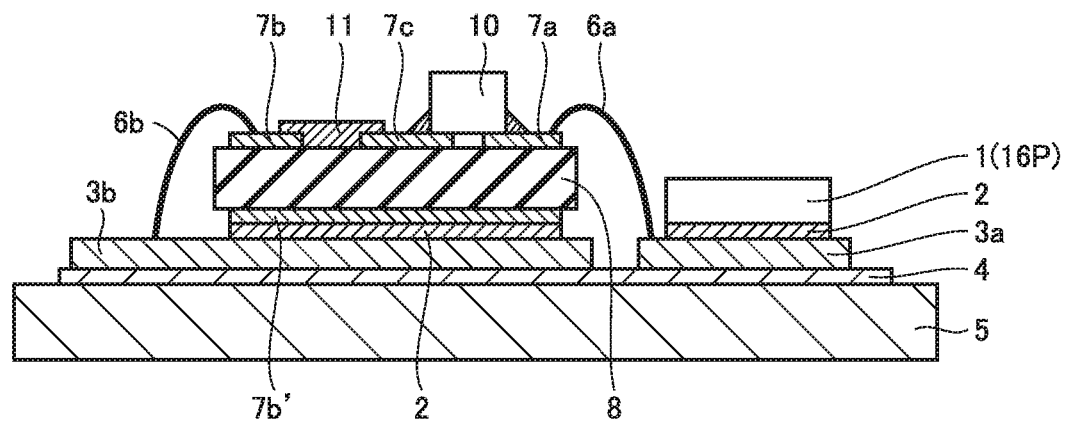
FIG. 2 is a schematic view showing a cross-sectional structure of a power semiconductor module according to the first embodiment of the present invention.
Figure 3:
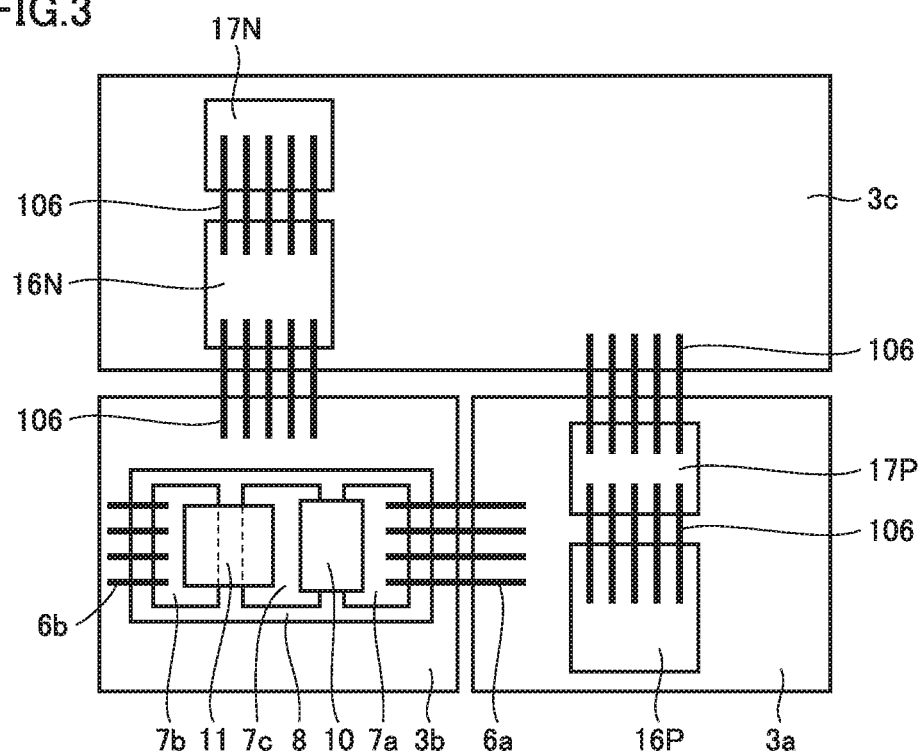
FIG. 3 is a schematic view showing a planar structure of the power semiconductor module according to the first embodiment of the present invention.
Figure 4:
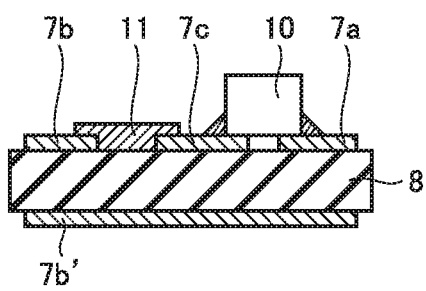
FIG. 4 is a schematic view showing a cross-sectional structure of a snubber substrate of the power semiconductor module according to the first embodiment of the present invention.
Figure 5:
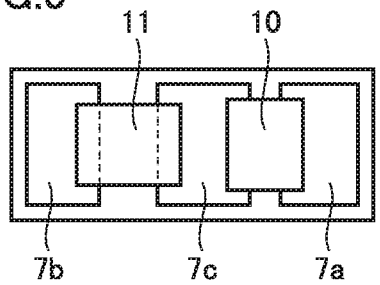
FIG. 5 is a schematic view showing a planar structure of the snubber substrate of the power semiconductor module according to the first embodiment of the present invention.

FIG. 1 is a schematic view showing a power conversion circuit in a power conversion device according to a first embodiment of the present invention. FIG. 2 is a schematic view showing a cross-sectional structure of a power semiconductor module according to the first embodiment of the present invention. FIG. 3 is a schematic view showing a planar structure of the power semiconductor module according to the first embodiment of the present invention. FIG. 4 is a schematic view showing a cross-sectional structure of a snubber substrate of the power semiconductor module according to the first embodiment of the present invention. FIG. 5 is a schematic view showing a planar structure of the snubber substrate of the power semiconductor module according to the first embodiment of the present invention. The power semiconductor module according to the present embodiment will be described with reference to FIGS. 1 to 5.

In FIG. 1, the power conversion device is formed of one power semiconductor module 14 and drives a motor 15. In power semiconductor module 14, three legs 20a, 20b and 20c are connected in parallel with a power supply 30. Each of legs 20a, 20b and 20c includes a positive electrode-side switching element 16P and a positive electrode-side freewheeling diode 17P as well as a negative electrode-side switching element 16N and a negative electrode-side freewheeling diode 17N.

In each of legs 20a, 20b and 20c, positive electrode-side switching element 16P and positive electrode-side freewheeling diode 17P connected in antiparallel with each other form a positive electrode-side power semiconductor element. In addition, negative electrode-side switching element 16N and negative electrode-side freewheeling diode 17N connected in antiparallel with each other form a negative electrode-side power semiconductor element. An intermediate point which is a connection point of the positive electrode-side power semiconductor element and the negative electrode-side power semiconductor element in each of legs 20a, 20b and 20c is connected to motor 15.

In leg 20c, a snubber circuit 13 is connected in parallel with a series circuit of the positive electrode-side power semiconductor element and the negative electrode-side power semiconductor element. Snubber circuit 13 is a circuit in which a capacitor 10 and a resistor 11 are connected in series. In the circuit shown in FIG. 1, snubber circuit 13 is arranged only in leg 20c. However, snubber circuit 13 may be arranged in another leg 20a or 20b, or snubber circuits 13 may be arranged in any two of legs 20a to 20c, or snubber circuits 13 may be arranged in all of legs 20a to 20c.

Description will be given below of an example in which SiC-MOSFET is applied as positive electrode-side switching element 16P and negative electrode-side switching element 16N (hereinafter, also simply referred to as "switching element") and SiC-SBD is applied as positive electrode-side freewheeling diode 17P and negative electrode-side freewheeling diode 17N (hereinafter, also simply referred to as "freewheeling diode").

In the case of using the power semiconductor module in which the SiC-SBD is mounted as the freewheeling diode in the power conversion circuit as shown in FIG. 1, ringing voltage may occur during a switching operation. As described above, ringing is caused by resonance based on a parasitic inductance of the power conversion circuit and a capacity of the SBD. When a peak value of ringing voltage exceeds a rated voltage of the power semiconductor module, the module may be broken. In addition, ringing voltage may cause noise, and thus, it is necessary to reduce ringing voltage as much as possible.

As effective means for reducing such ringing voltage, snubber circuit 13 is placed in the power conversion device shown in FIG. 1. Snubber circuit 13 is mounted between a positive electrode of the positive electrode-side power semiconductor element and a negative electrode of the negative electrode-side power semiconductor element. A mounting structure of snubber circuit 13 in the first embodiment of the present invention will be described below.

As shown in FIGS. 2 and 3, the power semiconductor module according to the first embodiment of the present invention includes a metal base 5, a positive electrode conductor pattern 3a, a negative electrode conductor pattern 3b, an AC electrode pattern 3c, positive electrode-side switching element 16P, positive electrode-side freewheeling diode 17P, negative electrode-side switching element 16N, negative electrode-side freewheeling diode 17N, an insulating substrate 8, and resistor 11 and capacitor 10 forming snubber circuit 13 (see FIG. 1) arranged on insulating substrate 8. FIGS. 2 and 3 correspond to the configuration of leg 20c in FIG. 1. Positive electrode conductor pattern 3a, negative electrode conductor pattern 3b and AC electrode pattern 3c are arranged to be spaced apart from one another on a main surface of metal base 5, with a joining member 4 being interposed. Joining member 4 is formed of a material made of ceramic, resin or the like and having an electrical insulating property. Positive electrode-side switching element 16P and positive electrode-side freewheeling diode 17P are arranged on positive electrode conductor pattern 3a. Insulating substrate 8 including snubber circuit 13 (see FIG. 1) is arranged on negative electrode conductor pattern 3b. Negative electrode-side switching element 16N and negative electrode-side freewheeling diode 17N are arranged on AC electrode pattern 3c.

In the power semiconductor module according to the first embodiment of the present invention, a positive electrode-side power semiconductor element 1 including positive electrode-side switching element 16P is connected to positive electrode conductor pattern 3a with solder 2 being interposed. In addition, a negative electrode-side power semiconductor element including negative electrode-side switching element 16N and negative electrode-side freewheeling diode 17N is similarly connected to AC electrode pattern 3c with solder being interposed.

As shown in FIGS. 2 to 5, a first wiring pattern 7a, a second wiring pattern 7b and a third wiring pattern 7c are formed on an upper surface of insulating substrate 8. A second wiring pattern 7b' is formed on a lower surface of insulating substrate 8. Capacitor 10 as a snubber capacitor is mounted between first wiring pattern 7a and third wiring pattern 7c. Resistor 11 as a snubber resistor is formed on insulating substrate 8 to connect second wiring pattern 7b and third wiring pattern 7c. Capacitor 10 and resistor 11 are connected in series to form a snubber circuit. Insulating substrate 8 and the snubber circuit formed on insulating substrate 8 form a snubber substrate.

The snubber substrate is arranged on negative electrode conductor pattern 3b as described above and is mounted on negative electrode conductor pattern 3b with solder 2 being interposed. Capacitor 10 is connected to positive electrode conductor pattern 3a by first wiring pattern 7a and a bonding wire 6a. Resistor 11 is connected to negative electrode conductor pattern 3b by second wiring pattern 7b and a bonding wire 6b. The snubber substrate may be arranged on positive electrode conductor pattern 3a, or may be arranged on AC electrode pattern 3c.

As shown in FIG. 3, positive electrode-side switching element 16P and positive electrode-side freewheeling diode 17P are connected to each other by a bonding wire 106, and are connected to AC electrode pattern 3c. Negative electrode-side switching element 16N and negative electrode-side freewheeling diode 17N are connected to each other by bonding wire 106, and are connected to negative electrode conductor pattern 3b.

The characteristic configuration of the above-described power semiconductor module will be summarized. The power semiconductor module includes: positive electrode-side switching element 16P and positive electrode-side freewheeling diode 17P corresponding to at least one positive electrode-side power semiconductor element; negative electrode-side switching element 16N and negative electrode-side freewheeling diode 17N corresponding to at least one negative electrode-side power semiconductor element; positive electrode conductor pattern 3a; negative electrode conductor pattern 3b; AC electrode pattern 3c; and the snubber substrate including insulating substrate 8 having the snubber circuit formed thereon. Positive electrode-side switching element 16P and positive electrode-side freewheeling diode 17P corresponding to the at least one positive electrode-side power semiconductor element are mounted on positive electrode conductor pattern 3a. Negative electrode conductor pattern 3b is connected to the negative electrode of negative electrode-side switching element 16N and negative electrode-side freewheeling diode 17N corresponding to the at least one negative electrode-side power semiconductor element. Negative electrode-side switching element 16N and negative electrode-side freewheeling diode 17N corresponding to the at least one negative electrode-side power semiconductor element are mounted on AC electrode pattern 3c. The snubber substrate includes insulating substrate 8 and at least one snubber circuit arranged on insulating substrate 8. The snubber substrate is arranged on at least one of positive electrode conductor pattern 3a, negative electrode conductor pattern 3b and AC electrode pattern 3c. The at least one snubber circuit is connected to positive electrode conductor pattern 3a and negative electrode conductor pattern 3b.

With such a configuration, one end of the snubber circuit is connected to positive electrode conductor pattern 3a and the other end of the snubber circuit is connected to negative electrode conductor pattern 3b. Thus, the snubber circuit is built into the power semiconductor module.

<Function and Effect of Power Semiconductor Module>

According to the power semiconductor module shown in FIGS. 1 to 5, one end of the snubber circuit is connected to positive electrode conductor pattern 3a and the other end of the snubber circuit is connected to negative electrode conductor pattern 3b, and the snubber circuit is arranged on at least one of positive electrode conductor pattern 3a, negative electrode conductor pattern 3b and AC electrode pattern 3c. Thus, the snubber circuit is mounted in the power semiconductor module. Therefore, ringing voltage that occurs during the switching operation can be reduced by the snubber circuit. Furthermore, the snubber substrate is arranged to overlap with at least one of positive electrode conductor pattern 3a, negative electrode conductor pattern 3b and AC electrode pattern 3c. Therefore, the wiring length can be reduced and the parasitic inductance of the wiring can be reduced, as compared with the case in which the snubber substrate is arranged planarly side by side with positive electrode conductor pattern 3a and negative electrode conductor pattern 3b. From a different point of view, the snubber circuit is built into the power semiconductor module, and thus, the snubber circuit can be provided at a position close to the power semiconductor element such as positive electrode-side switching element 16P and positive electrode-side freewheeling diode 17P, i.e., at a distance of low inductance, as compared with the case in which the snubber circuit is provided outside the power semiconductor module. Therefore, the effect of reducing ringing voltage can be enhanced and the power semiconductor module can be reduced in size.

When the snubber circuit formed by connecting capacitor 10 and resistor 11 in series is provided, a current flows through resistor 11, resulting in a heat generation so that heat dissipation is necessary. Resistor 11 is formed, using a printing method, on insulating substrate 8 to connect second wiring pattern 7b and third wiring pattern 7c. Therefore, a contact area between resistor 11 and insulating substrate 8 is relatively large, and thus, resistor 11 is superior in heat dissipation property to a common chip resistor. Furthermore, a heat release path is formed to extend from resistor 11 to negative electrode conductor pattern 3b through insulating substrate 8, second wiring pattern 7b' and solder 2. Therefore, the heat diffuses planarly on negative electrode conductor pattern 3b and is released to metal base 5 through joining member 4. Thus, the excellent heat dissipation property is achieved.

The above-described power semiconductor module includes first bonding wire 6a and second bonding wire 6b. First bonding wire 6a connects at least one snubber circuit and positive electrode conductor pattern 3a. Second bonding wire 6b connects at least one snubber circuit and negative electrode conductor pattern 3b.

In this case, by using first and second bonding wires 6a and 6b, the snubber circuit mounted in the snubber substrate arranged on at least one of positive electrode conductor pattern 3a, negative electrode conductor pattern 3b and AC electrode pattern 3c can be easily connected to positive electrode conductor pattern 3a and negative electrode conductor pattern 3b. As a result, ringing voltage can be reduced by the snubber circuit.

In the above-described power semiconductor module, at least one snubber circuit is a circuit in which capacitor 10 and resistor 11 are connected in series. In this case, the peak voltage of ringing can be reduced and ringing can be quickly attenuated.

In the above-described power semiconductor module, capacitor 10 and resistor 11 are formed on the upper surface which is a first main surface of insulating substrate 8. In this case, a capacitor, a resistor and the like are not arranged on the lower surface which is the other surface different from the first main surface of insulating substrate 8, e.g., a second main surface opposite to the first main surface, and thus, the other surface can be used as a heat dissipating surface. Therefore, the heat generated from resistor 11 can be easily dissipated from the lower surface which is the other surface of insulating substrate 8 to the outside of insulating substrate 8, e.g., metal base 5.

In the above-described power semiconductor module, resistor 11 is a thick film resistor arranged on the first main surface of insulating substrate 8. In this case, the contact area between resistor 11 formed using, for example, the printing method and insulating substrate 8 can be increased, as compared with the case of mounting another resistive element as resistor 11 on insulating substrate 8. Therefore, the heat generated from resistor 11 is efficiently dissipated through insulating substrate 8, as compared with the case of using the above-described resistive element.

In the above-described power semiconductor module, at least one positive electrode-side power semiconductor element includes first to third positive electrode-side power semiconductor elements formed by three positive electrode-side switching elements 16P and three positive electrode-side freewheeling diodes 17P as shown in FIG. 1. At least one negative electrode-side power semiconductor element includes first to third negative electrode-side power semiconductor elements formed by three negative electrode-side switching elements 16N and three negative electrode-side freewheeling diodes 17N. The first positive electrode-side power semiconductor element and the first negative electrode-side power semiconductor element are connected in series to form first leg 20a. The second positive electrode-side power semiconductor element and the second negative electrode-side power semiconductor element are connected in series to form second leg 20b. The third positive electrode-side power semiconductor element and the third negative electrode-side power semiconductor element are connected in series to form third leg 20c. In this case, the power semiconductor module includes first to third legs 20a to 20c, and thus, the power conversion device applicable to, for example, a three-phase AC power supply can be implemented by one power semiconductor module.

In the above-described power semiconductor module, each of at least one positive electrode-side power semiconductor element formed by positive electrode-side switching element 16P and positive electrode-side freewheeling diode 17P, and at least one negative electrode-side power semiconductor element formed by negative electrode-side switching element 16N and negative electrode-side freewheeling diode 17N is formed of a wide bandgap semiconductor. In this case, in addition to the above-described effect of reducing ringing voltage, a higher speed of the switching operation and a higher-temperature operation can be achieved in the positive electrode-side power semiconductor element and the negative electrode-side power semiconductor element.

In the above-described power semiconductor module, the wide bandgap semiconductor is one selected from the group consisting of silicon carbide (SiC), gallium nitride (GaN), diamond, and gallium oxide. In this case, by using the above-described material as the wide bandgap semiconductor forming the positive electrode-side power semiconductor element and the negative electrode-side power semiconductor element, a higher breakdown voltage of the above-described elements can also be achieved, in addition to the higher speed of the switching operation and the higher-temperature operation.

<Configuration and Function and Effect of Modification of Power Semiconductor Module>

Figure 6:
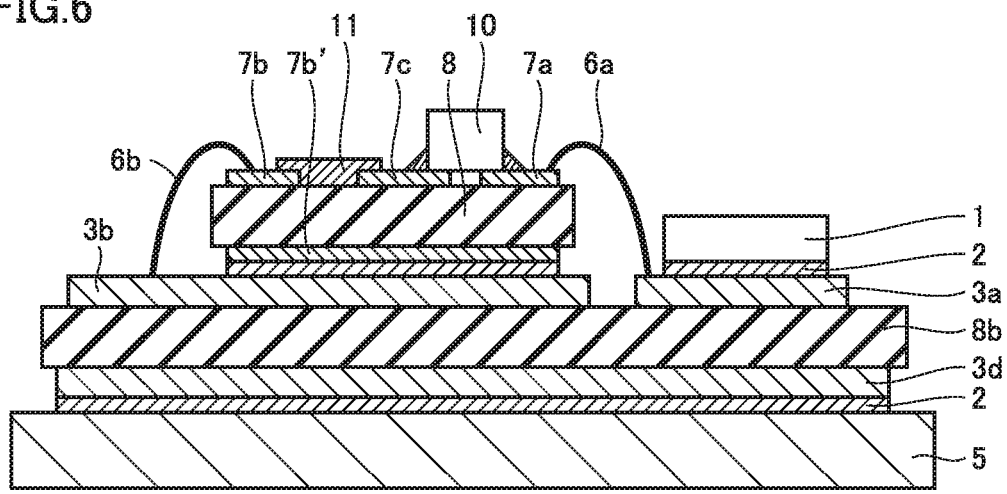
FIG. 6 is a schematic view showing a cross-sectional structure of a modification of the power semiconductor module according to the first embodiment of the present invention.

FIG. 6 is a schematic view showing a cross-sectional structure of a modification of the power semiconductor module according to the first embodiment of the present invention. FIG. 6 corresponds to FIG. 2. FIG. 2 shows the example in which positive electrode conductor pattern 3a and negative electrode conductor pattern 3b are connected to metal base 5 with joining member 4 exhibiting the electrical insulating property being interposed. However, as shown in FIG. 6, positive electrode conductor pattern 3a, negative electrode conductor pattern 3b and not-shown AC electrode pattern 3c may be connected to metal base 5 with a second insulating substrate 8b, a rear surface conductor pattern 3d and solder 2 being interposed.

The first embodiment describes the example in which the snubber substrate corresponding to insulating substrate 8 on which the snubber circuit formed by capacitor 10 and resistor 11 is mounted is arranged on negative electrode conductor pattern 3b. However, the snubber substrate may be arranged on positive electrode conductor pattern 3a. In this case, the positive electrode side of the snubber circuit may be connected to positive electrode conductor pattern 3a by bonding wire 6a, and the negative electrode side of the snubber circuit may be connected to negative electrode conductor pattern 3b by bonding wire 6b. Alternatively, the snubber substrate may be arranged on AC electrode pattern 3c. In this case, the positive electrode side of the snubber circuit may be connected to positive electrode conductor pattern 3a by bonding wire 6a, and the negative electrode side of the snubber circuit may be connected to negative electrode conductor pattern 3b by bonding wire 6b. The positional relation between positive electrode-side switching element 16P and positive electrode-side freewheeling diode 17P, the positional relation between negative electrode-side switching element 16N and negative electrode-side freewheeling diode 17N, and the size and the positional relation of positive electrode conductor pattern 3a, negative electrode conductor pattern 3b and AC electrode pattern 3c in FIG. 3 are one example and are not limited to the arrangement shown in FIG. 3.

Second Embodiment

<Configuration of Power Semiconductor Module>

Figure 7:
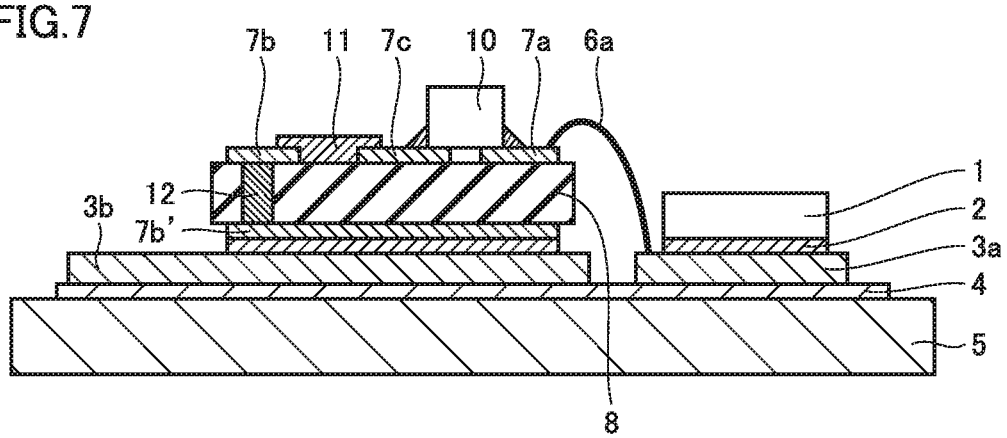
FIG. 7 is a schematic view showing a cross-sectional structure of a power semiconductor module according to a second embodiment of the present invention.

FIG. 7 is a schematic view showing a cross-sectional structure of a power semiconductor module according to a second embodiment of the present invention. FIG. 8 is a schematic view showing a cross-sectional structure of a snubber substrate of the power semiconductor module according to the second embodiment of the present invention. FIG. 9 is a schematic view showing a planar structure of the snubber substrate of the power semiconductor module according to the second embodiment of the present invention. Although the power semiconductor module shown in FIGS. 7 to 9 is configured almost similarly to the power semiconductor module shown in FIGS. 1 to 5, the power semiconductor module shown in FIGS. 7 to 9 is different from the power semiconductor module shown in FIGS. 1 to 5 in terms of a connection structure for a snubber circuit and negative electrode conductor pattern 3b. Specifically, second wiring pattern 7b connected to resistor 11 formed on an upper surface of insulating substrate 8 forming the snubber circuit is connected to negative electrode conductor pattern 3b with a conductor in a through hole 12, second wiring pattern 7b' and solder 2 being interposed.

The second embodiment describes the example in which the snubber substrate corresponding to insulating substrate 8 on which the snubber circuit formed by capacitor 10 and resistor 11 is mounted is arranged on negative electrode conductor pattern 3b. However, the snubber substrate may be arranged on positive electrode conductor pattern 3a, the positive electrode side of the snubber circuit may be connected to positive electrode conductor pattern 3a by through hole 12, and the negative electrode side of the snubber circuit may be connected to negative electrode conductor pattern 3b by a bonding wire.

From a different point of view, in the power semiconductor module shown in FIG. 7, through hole 12 is formed in insulating substrate 8. The power semiconductor module includes a conductor arranged in through hole 12 and connected to at least one snubber circuit. The conductor is connected to one of positive electrode conductor pattern 3a and negative electrode conductor pattern 3b located under the snubber substrate. The power semiconductor module further includes bonding wire 6a. Bonding wire 6a connects at least one snubber circuit and the other of positive electrode conductor pattern 3a and negative electrode conductor pattern 3b.

<Function and Effect of Power Semiconductor Module>

With such a configuration, the effect similar to that of the power semiconductor module according to the first embodiment of the present invention can be obtained. That is, one end of the snubber circuit is connected to positive electrode conductor pattern 3a by bonding wire 6a, while the other end of the snubber circuit is connected to negative electrode conductor pattern 3b by the conductor arranged in through hole 12, and thus, the snubber circuit is built into the power semiconductor module. Since the snubber circuit is built into the power semiconductor module, the snubber circuit is provided at a position close to the power semiconductor element such as positive electrode-side switching element 16P, as compared with the case in which the snubber circuit is provided outside the power semiconductor module, and thus, the effect of reducing ringing voltage can be enhanced. Particularly, resistor 11 and negative electrode conductor pattern 3b are connected by the conductor in through hole 12 as shown in FIG. 7, and thus, the wiring inductance between the snubber circuit and the power semiconductor element can be reduced, as compared with the case of connecting resistor 11 and negative electrode conductor pattern 3b by using the bonding wire. As a result, the effect of reducing ringing voltage by the snubber circuit can be further enhanced.

Third Embodiment

<Configuration of Power Semiconductor Module>

Figure 11:
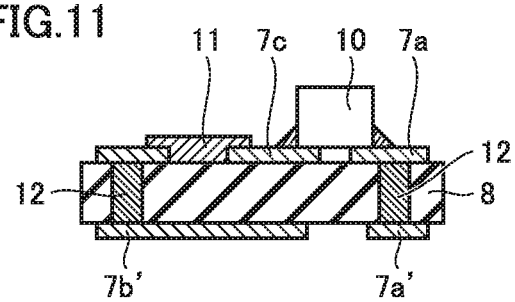
FIG. 11 is a schematic view showing a cross-sectional structure of a snubber substrate of the power semiconductor module according to the third embodiment of the present invention.
Figure 12:
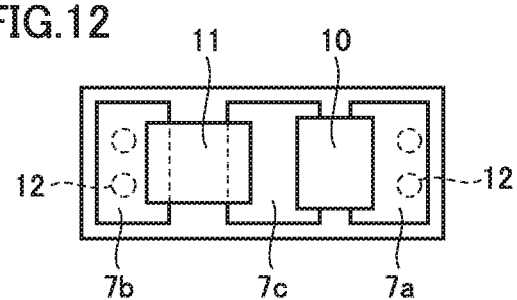
FIG. 12 is a schematic view showing a planar structure of the snubber substrate of the power semiconductor module according to the third embodiment of the present invention.

FIG. 10 is a schematic view showing a cross-sectional structure of a power semiconductor module according to a third embodiment of the present invention. FIG. 11 is a schematic view showing a cross-sectional structure of a snubber substrate of the power semiconductor module according to the third embodiment of the present invention. FIG. 12 is a schematic view showing a planar structure of the snubber substrate of the power semiconductor module according to the third embodiment of the present invention. Although the power semiconductor module shown in FIGS. 10 to 12 is configured almost similarly to the power semiconductor module shown in FIGS. 7 to 9, the power semiconductor module shown in FIGS. 10 to 12 is different from the power semiconductor module shown in FIGS. 7 to 9 in terms of the arrangement of insulating substrate 8 and the configuration of a connection portion of a snubber circuit and positive electrode conductor pattern 3a. In the power semiconductor module shown in FIGS. 10 to 12, a first wiring pattern 7a' and second wiring pattern 7b' are formed on a lower surface of insulating substrate 8. The snubber substrate corresponding to insulating substrate 8 on which the snubber circuit is formed is arranged to extend over both a part of positive electrode conductor pattern 3a and a part of negative electrode conductor pattern 3b. The positive electrode side of capacitor 10 is connected to positive electrode conductor pattern 3a with first wiring pattern 7a, a conductor in through hole 12, first wiring pattern 7a', and solder 2 being interposed. The negative electrode side of resistor 11 is connected to negative electrode conductor pattern 3b with second wiring pattern 7b, a conductor in through hole 12, second wiring pattern 7b', and solder 2 being interposed.

From a different point of view, in the power semiconductor module shown in FIGS. 10 to 12, at least one snubber circuit is arranged on both positive electrode conductor pattern 3a and negative electrode conductor pattern 3b. In insulating substrate 8, first through hole 12 is formed in a portion located on positive electrode conductor pattern 3a, and second through hole 12 is formed in a portion located on negative electrode conductor pattern 3b. The snubber substrate includes a first conductor and a second conductor. The first conductor is arranged in first through hole 12 and is connected to at least one snubber circuit. The second conductor is arranged in second through hole 12 and is connected to at least one snubber circuit. The first conductor is connected to positive electrode conductor pattern 3a. The second conductor is connected to negative electrode conductor pattern 3b.

<Function and Effect of Power Semiconductor Module>

With such a configuration, the effect similar to that of the power semiconductor module according to the second embodiment of the present invention can be obtained. That is, one end of the snubber circuit is connected to positive electrode conductor pattern 3a by the through hole, and the other end of the snubber circuit is connected to negative electrode conductor pattern 3b by the through hole. In this way, the snubber circuit is built into the power semiconductor module. Since the snubber circuit is built into the power semiconductor module, the snubber circuit is provided at a position close to the power semiconductor element, as compared with the case in which the snubber circuit is provided outside the power semiconductor module, and thus, the effect of reducing ringing voltage can be enhanced. Particularly, the positive electrode side of the snubber circuit is connected to positive electrode conductor pattern 3a by the conductor in through hole 12 and the negative electrode side of the snubber circuit is connected to negative electrode conductor pattern 3b by the conductor in through hole 12, and thus, the wiring inductance between the snubber circuit and the power semiconductor element can be reduced, as compared with the case of using the bonding wire. As a result, the effect of reducing ringing voltage by the snubber circuit can be further enhanced.

Fourth Embodiment

<Configuration of Power Semiconductor Module>

Figure 13:
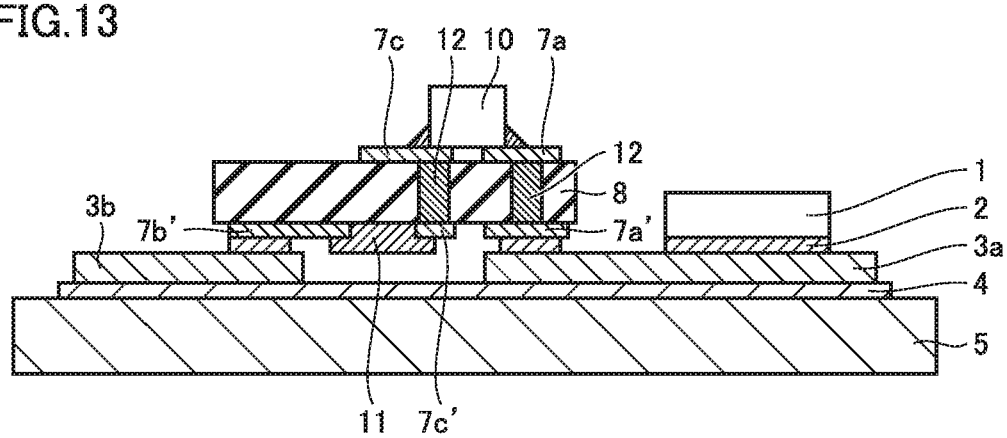
FIG. 13 is a schematic view showing a cross-sectional structure of a power semiconductor module according to a fourth embodiment of the present invention.
Figure 14:
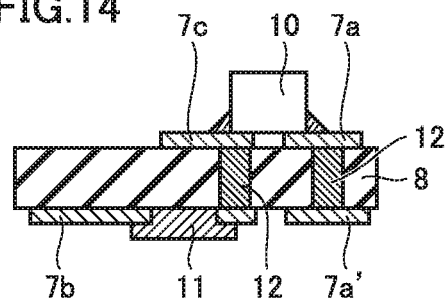
FIG. 14 is a schematic view showing a cross-sectional structure of a snubber substrate of the power semiconductor module according to the fourth embodiment of the present invention.
Figure 15:
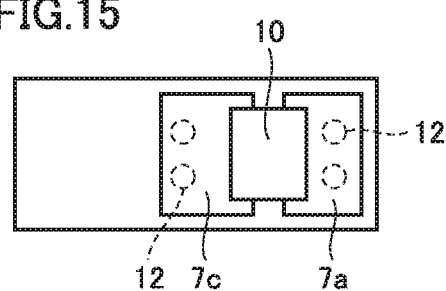
FIG. 15 is a schematic view showing a planar structure of the snubber substrate of the power semiconductor module according to the fourth embodiment of the present invention.

FIG. 13 is a schematic view showing a cross-sectional structure of a power semiconductor module according to a fourth embodiment of the present invention. FIG. 14 is a schematic view showing a cross-sectional structure of a snubber substrate of the power semiconductor module according to the fourth embodiment of the present invention. FIG. 15 is a schematic view showing a planar structure of the snubber substrate of the power semiconductor module according to the fourth embodiment of the present invention. Although the power semiconductor module shown in FIGS. 13 to 15 is configured almost similarly to the power semiconductor module shown in FIGS. 10 to 12, the power semiconductor module shown in FIGS. 13 to 15 is different from the power semiconductor module shown in FIGS. 10 to 12 in terms of the arrangement of resistor 11 in a snubber circuit and the configuration of insulating substrate 8. That is, in the power semiconductor module shown in FIGS. 13 to 15, capacitor 10 and resistor 11 are mounted on different surfaces of the snubber substrate.

In the power semiconductor module shown in FIGS. 13 to 15, first wiring pattern 7a and third wiring pattern 7c are formed on an upper surface of insulating substrate 8. In addition, first wiring pattern 7a', second wiring pattern 7b' and a third wiring pattern 7c' are formed on a lower surface of insulating substrate 8. Capacitor 10 is mounted between first wiring pattern 7a and third wiring pattern 7c. Resistor 11 is formed on a surface different from capacitor 10, i.e., on the lower surface of insulating substrate 8 to connect second wiring pattern 7b' and third wiring pattern 7c'. Third wiring pattern 7c located on the upper surface of insulating substrate 8 and third wiring pattern 7c' located on the lower surface of insulating substrate 8 are connected by a conductor in through hole 12. As a result, capacitor 10 and resistor 11 are connected in series to form the snubber circuit. Insulating substrate 8 having the snubber circuit formed thereon forms the snubber substrate. The snubber substrate is arranged to extend over a part of positive electrode conductor pattern 3a and a part of negative electrode conductor pattern 3b.

The positive electrode side of capacitor 10 is connected to positive electrode conductor pattern 3a with first wiring pattern 7a, a conductor in through hole 12, first wiring pattern 7a', and solder 2 being interposed. The negative electrode side of resistor 11 is connected to negative electrode conductor pattern 3b with second wiring pattern 7b' and solder 2 being interposed.

In the fourth embodiment, capacitor 10 is mounted on an upper surface of the snubber substrate and resistor 11 is mounted on a lower surface of the snubber substrate. However, resistor 11 may be mounted on the upper surface of the snubber substrate and capacitor 10 may be mounted on the lower surface of the snubber substrate.

From a different point of view, in the power semiconductor module shown in FIGS. 13 to 15, capacitor 10 is formed on the upper surface which is a first main surface of insulating substrate 8. Resistor 11 is formed on the lower surface which is a second main surface different from the first main surface of insulating substrate 8. That is, capacitor 10 and resistor 11 are formed on the different surfaces of insulating substrate 8.

<Function and Effect of Power Semiconductor Module>

With such a configuration, the effect similar to that of the power semiconductor module according to the third embodiment of the present invention can be obtained. That is, since capacitor 10 and resistor 11 forming the snubber circuit are mounted on both surfaces of the snubber substrate and are built into the power semiconductor module, the snubber circuit is provided at a position close to the power semiconductor element, as compared with the case in which the snubber circuit is provided outside the power semiconductor module. As a result, the effect of reducing ringing voltage can be enhanced. In addition, capacitor 10 and resistor 11 can be arranged to overlap with each other when the snubber substrate is viewed planarly, and thus, an area of the snubber substrate, i.e., an area of insulating substrate 8 can be reduced. Therefore, the power semiconductor module having the snubber substrate built thereinto can be reduced in size.

Figure 19:
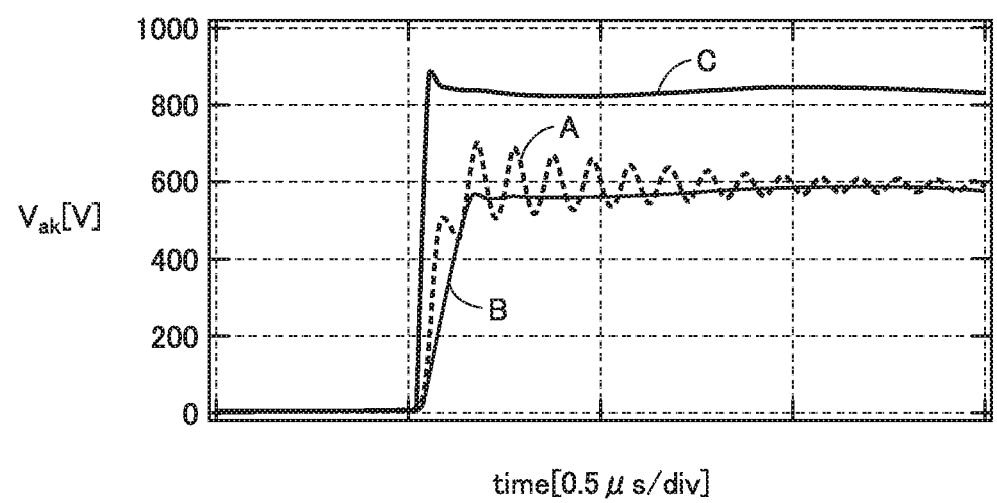
FIG. 19 shows an experimental result about reducing a ringing voltage by having a snubber built thereinto.

FIG. 19 shows an experimental result about reducing the ringing voltage by having a CR snubber built into a power semiconductor module. The vertical axis in FIG. 19 represents anode-cathode voltage of a freewheeling diode of an opposing arm during a turn-on operation. The horizontal axis in FIG. 19 represents the time. A rated voltage of the power semiconductor module used in the experiment is 1200V. A broken line A represents a voltage waveform between an anode and a cathode of a power semiconductor module not having a snubber circuit built thereinto. A voltage change rate of the voltage between the anode and the cathode is about 15 V/ns. The voltage change rate of 15 V/ns is a quite high switching speed for a voltage change rate when driving the normal power semiconductor module not having the snubber circuit built thereinto.

On the other hand, a thin solid line B represents a waveform when the snubber circuit is built into the module. Although ringing voltage is reduced by having the snubber circuit built into the module, the voltage change rate of the anode-cathode voltage decreases to about 5 V/ns. As described above, it can be seen that when the power semiconductor element is driven by using the same gate driving circuit, the module having the snubber circuit built thereinto causes a decrease in voltage change rate from about 15 V/ns to about 5 V/ns.

The decrease in voltage change rate causes an increase in switching loss, and thus, it is desirable to perform the switching operation at highest possible speed. Thus, using the power semiconductor module having the snubber circuit built thereinto, a switching operation test was conducted in a state where a gate resistance was low and a DC link voltage was increased from 600V to 850V. A thick solid line C represents an experimental result when the power semiconductor element is driven at the voltage change rate of 30 V/ns which is twice as high as the normal switching speed. It can be seen that under this condition as well, ringing voltage does not occur and the voltage peak value is equal to or smaller than the rated voltage value of the power semiconductor module. In addition, the DC link voltage is generally set at one-half to two-thirds of the rated voltage of the power semiconductor module, and thus, the DC link voltage is 600 V to 800 V in the case of the power semiconductor module rated at 1200 V. The result shown in FIG. 19 indicates that the power semiconductor module can be used at the high DC link voltage of 850V. Based on this, the power semiconductor module having the snubber circuit built thereinto has the effect of enabling the high-speed switching operation at the voltage change rate of not less than 15 V/ns and reducing the switching loss. That is, the power semiconductor module according to the present embodiment can be operated at the voltage change rate of not less than 15 V/ns during switching.

Fifth Embodiment

<Configuration of Power Semiconductor Module>

Figure 16:
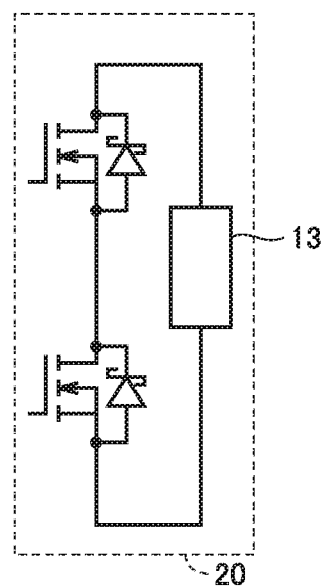
FIG. 16 is a schematic view showing one leg in a power conversion circuit according to a fifth embodiment of the present invention.
Figure 17:
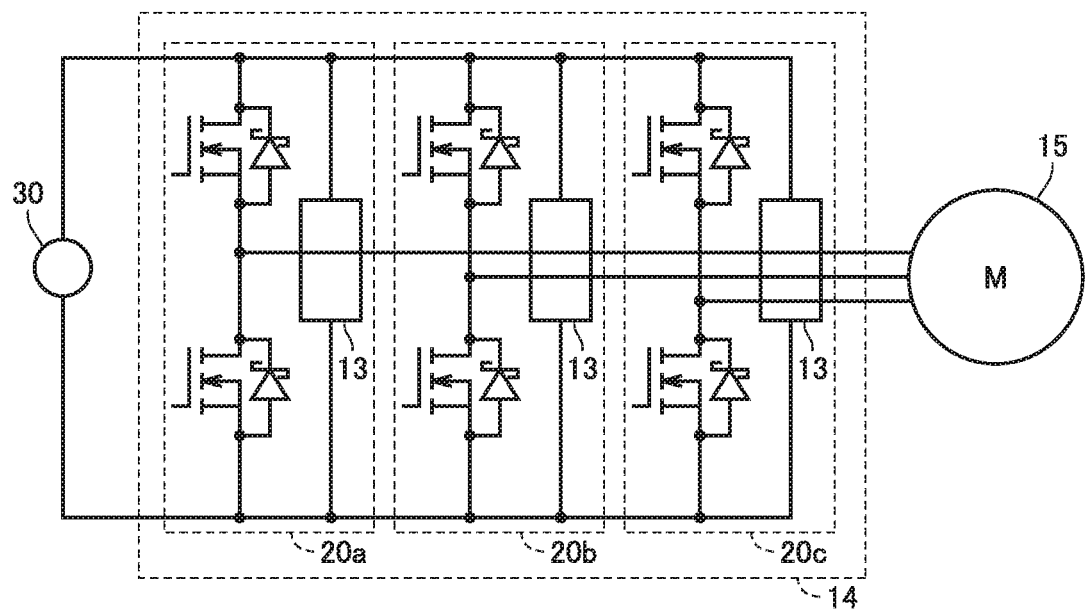
FIG. 17 is a schematic view showing the power conversion circuit according to the fifth embodiment of the present invention.

FIG. 16 is a schematic view showing one leg in a power conversion circuit forming a power semiconductor module according to a fifth embodiment of the present invention. FIG. 17 is a schematic view showing the power conversion circuit according to the fifth embodiment of the present invention. A leg 20 shown in FIG. 16 forms the power conversion circuit shown in FIG. 17. Leg 20 shown in FIG. 16 is formed by connecting a positive electrode-side power semiconductor element and a negative electrode-side power semiconductor element in series. In addition, one snubber circuit 13 is mounted in leg 20 shown in FIG. 16. The positive electrode side of snubber circuit 13 is connected to a positive electrode of the positive electrode-side power semiconductor element, and the negative electrode side of snubber circuit 13 is connected to a negative electrode of the negative electrode-side power semiconductor element.

With such a configuration, the power conversion device shown in FIG. 17 can be formed by using leg 20 as the power semiconductor module having the snubber circuit built thereinto. In this case, snubber circuit 13 is mounted in each leg that performs the switching operation, and thus, the effect of reducing ringing voltage can be enhanced.

Three legs 20 as the power semiconductor modules shown in FIG. 16 are connected in parallel to form the power conversion device shown in FIG. 17. Although the power conversion device shown in FIG. 17 is configured almost similarly to the power conversion device shown in FIG. 1, the power conversion device shown in FIG. 17 is different from the power conversion device shown in FIG. 1 in that each of three legs 20a to 20c includes snubber circuit 13. In power semiconductor module 14 formed of three legs 20a to 20c, first to third snubber circuits 13 are mounted in legs 20a, 20b and 20c, respectively. From a different point of view, at least one snubber circuit forming the power semiconductor module includes first to third snubber circuits 13 connected to first to third legs 20a to 20c, respectively. The positive electrode side of snubber circuit 13 is connected to a positive electrode of the positive electrode-side power semiconductor element, and the negative electrode side of snubber circuit 13 is connected to a negative electrode of the negative electrode-side power semiconductor element.

<Function and Effect of Power Semiconductor Module>

With such a configuration, the power conversion device can be formed by using legs 20a to 20c as the power semiconductor modules having snubber circuits 13 built thereinto, and the snubber circuit is mounted in each of legs 20a, 20b and 20c that perform the switching operation. Therefore, the effect of reducing ringing voltage can be enhanced.

Sixth Embodiment

<Configuration of Power Conversion Device>

In the present embodiment, the power semiconductor module according to any one of the first to fifth embodiments described above is applied to a power conversion device. While the present invention is not limited to a particular power conversion device, a sixth embodiment will be described below in connection with the case in which the present invention is applied to a three-phase inverter.

Figure 18:
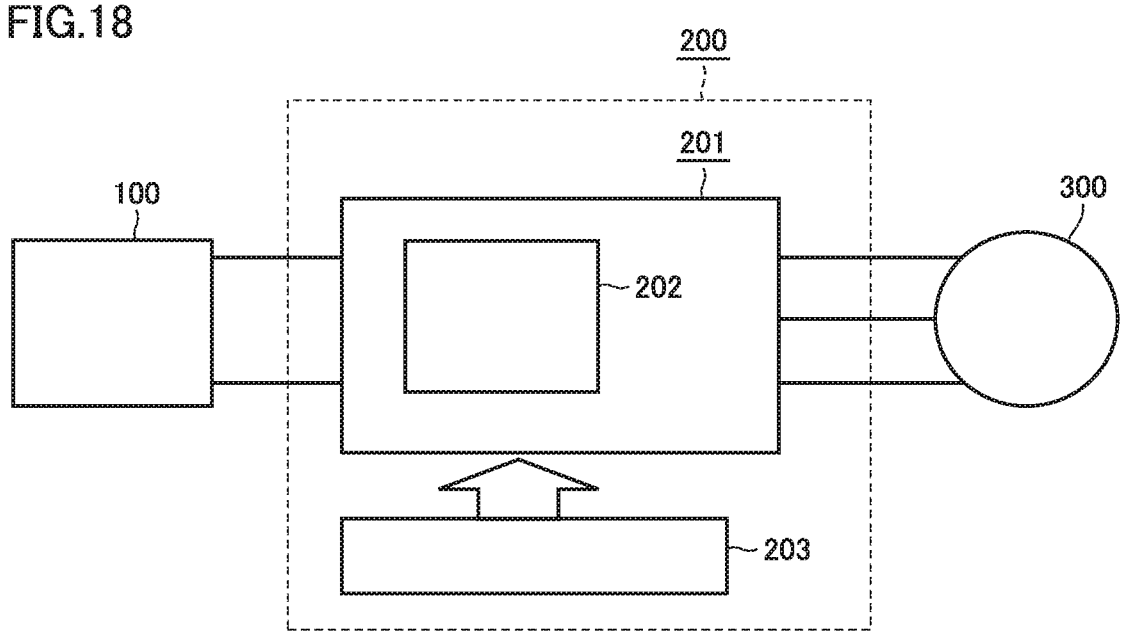
FIG. 18 is a block diagram showing a configuration of a power conversion system according to a sixth embodiment of the present invention.

FIG. 18 is a block diagram showing a configuration of a power conversion system to which the power conversion device according to the present embodiment is applied.

The power conversion system shown in FIG. 18 is formed of a power supply 100, a power conversion device 200 and a load 300. Power supply 100 is a DC power supply and is configured to supply DC power to power conversion device 200. Power supply 100 can be implemented by various components. For example, power supply 100 may be implemented by a DC system, a solar battery or a storage battery, or may be implemented by a rectifying circuit or an AC/DC converter connected to an AC system. Alternatively, power supply 100 may be implemented by a DC/DC converter configured to convert DC power output from a DC system to prescribed power.

Power conversion device 200 is a three-phase inverter connected between power supply 100 and load 300, and is configured to convert the DC power supplied from power supply 100 to AC power and supply the AC power to load 300. As shown in FIG. 18, power conversion device 200 includes a main conversion circuit 201 configured to convert the DC power to the AC power and output the AC power, and a control circuit 203 configured to output a control signal for controlling main conversion circuit 201 to main conversion circuit 201.

Load 300 is a three-phase motor driven by the AC power supplied from power conversion device 200. Load 300 is not limited to a particular application. Load 300 is a motor mounted on various types of electrical equipment, and is used as a motor for, for example, a hybrid vehicle or an electric vehicle, a railroad vehicle, an elevator, or an air conditioner.

The details of power conversion device 200 will be described below. Main conversion circuit 201 includes a switching element and a freewheeling diode (not shown), and the switching element performs switching to thereby convert the DC power supplied from power supply 100 to the AC power and supply the AC power to load 300. While there are various specific circuit configurations of main conversion circuit 201, main conversion circuit 201 according to the present embodiment is a two-level three-phase full-bridge circuit and can be formed of six switching elements and six freewheeling diodes connected in antiparallel with the respective switching elements. The elements forming the power semiconductor module according to any one of the first to fifth embodiments described above can be applied as each switching element and each freewheeling diode of main conversion circuit 201. The power semiconductor module according to any one of the first to fifth embodiments described above can be applied as a semiconductor module 202 forming main conversion circuit 201. The above-described six switching elements and the six freewheeling diodes connected in antiparallel with the respective switching elements form three positive electrode-side power semiconductor element groups and three negative electrode-side power semiconductor element groups. One positive electrode-side power semiconductor element group and one negative electrode-side power semiconductor element group are connected in series to form a leg (upper and lower arms) and form any one of the U phase, the V phase and the W phase. Output terminals of the respective legs (upper and lower arms), i.e., three output terminals of main conversion circuit 201 are connected to load 300.

Although main conversion circuit 201 includes a driving circuit (not shown) configured to drive each switching element, the driving circuit may be built into semiconductor module 202, or may be provided separately from semiconductor module 202. The driving circuit generates a driving signal for driving each switching element of main conversion circuit 201 and supplies the driving signal to a control electrode of each switching element of main conversion circuit 201. Specifically, in accordance with a control signal provided from control circuit 203, the driving circuit outputs a driving signal for turning on each switching element and a driving signal for turning off each switching element to the control electrode of each switching element.

<Function and Effect of Power Conversion Device>

In the power conversion device according to the present embodiment, the power semiconductor module according to any one of the first to fifth embodiments is applied as semiconductor module 202 of main conversion circuit 201. Therefore, snubber circuit 13 is built into semiconductor module 202, and thus, ringing voltage can be effectively reduced. In addition, semiconductor module 202 and the power conversion device can be reduced in size.

Although the present embodiment has been described in connection with the example in which the present invention is applied to the two-level three-phase inverter, the present invention is not limited thereto and the present invention is applicable to various power conversion devices. Although the two-level power conversion device is used in the present embodiment, a three-level or multi-level power conversion device may be used, or the present invention may be applied to a single-phase inverter when electric power is supplied to a single-phase load. When electric power is supplied to a DC load or the like, the present invention can also be applied to a DC/DC converter or an AC/DC converter.

In addition, the power conversion device to which the present invention is applied is not limited to the case in which the above-described load is a motor. The power conversion device to which the present invention is applied can also be used as, for example, a power supply device of a discharge processing machine, a laser processing machine, an induction heating cooker, or a wireless power transfer system. Furthermore, the power conversion device to which the present invention is applied can also be used as a power conditioner of a photovoltaic power generation system, a power storage system or the like.

It should be understood that the embodiments disclosed herein are illustrative and non-restrictive in every respect. The scope of the present invention is defined by the terms of the claims, rather than description of the embodiments above, and is intended to include any modifications within the scope and meaning equivalent to the terms of the claims.

REFERENCE SIGNS LIST 1 positive electrode-side power semiconductor element; 2 solder; 3a positive electrode conductor pattern; 3b negative electrode conductor pattern; 3c AC electrode pattern; 3d rear surface conductor pattern; 4 joining member; 5 metal base; 6a, 6b, 106 bonding wire; 7a first wiring pattern; 7b second wiring pattern; 7c third wiring pattern; 8 insulating substrate; 8b second insulating substrate; 10 capacitor; 11 resistor; 12 through hole; 13 snubber circuit; 14 power semiconductor module; 15 motor; 16N negative electrode-side switching element; 16P positive electrode-side switching element; 17N negative electrode-side freewheeling diode; 17P positive electrode-side freewheeling diode; 20, 20a, 20b, 20c leg; 30, 100 power supply; 200 power conversion device; 201 main conversion circuit; 202 semiconductor module; 203 control circuit; 300 load.

The invention claimed is:

1. A power semiconductor module comprising:
a metal base;
at least one positive electrode-side power semiconductor element;
at least one negative electrode-side power semiconductor element;
a positive electrode conductor pattern member including a positive electrode conductor pattern, the positive electrode conductor pattern having the at least one positive electrode-side power semiconductor element mounted thereon;
a negative electrode conductor pattern member including a negative electrode conductor pattern, the negative electrode conductor pattern being connected to a negative electrode of the at least one negative electrode-side power semiconductor element;
an AC electrode pattern member including an AC electrode pattern, the AC electrode pattern having the at least one negative electrode-side power semiconductor element mounted thereon, and being connected to a negative electrode of the at least one positive electrode-side power semiconductor element; and
a snubber substrate,
the positive electrode conductor pattern member, the negative electrode conductor pattern member and the AC electrode pattern member being arranged to be spaced apart from one another on a main surface of the metal base, with an insulating member being interposed,
the snubber substrate including:
an insulating substrate having a first wiring pattern, a second wiring pattern and a third wiring pattern located between the first wiring pattern and the second wiring pattern; and
at least one snubber circuit arranged on the insulating substrate,
the at least one snubber circuit being a circuit in which a capacitor and a resistor are connected in series, the capacitor and the resistor being electrically connected to the third wiring pattern,
the snubber substrate being arranged to overlap with at least one of the positive electrode conductor pattern, the negative electrode conductor pattern and the AC electrode pattern,
the at least one snubber circuit being connected to the positive electrode conductor pattern and the negative electrode conductor pattern.

2. The power semiconductor module according to claim 1, further comprising:
a first bonding wire configured to connect the at least one snubber circuit and the positive electrode conductor pattern; and
a second bonding wire configured to connect the at least one snubber circuit and the negative electrode conductor pattern.

3. The power semiconductor module according to claim 1, wherein
a through hole is formed in the insulating substrate,
the power semiconductor module further comprising:
a conductor, wherein the conductor is in the through hole and connected to the at least one snubber circuit, wherein the conductor is connected to one of the positive electrode conductor pattern and the negative electrode conductor pattern, the one of the positive electrode conductor pattern and the negative electrode conductor pattern being located under the snubber substrate; and
a bonding wire configured to connect the at least one snubber circuit and the other of the positive electrode conductor pattern and the negative electrode conductor pattern.

4. The power semiconductor module according to claim 1, wherein
the at least one snubber circuit is arranged on both of the positive electrode conductor pattern and the negative electrode conductor pattern,
in the insulating substrate, a first through hole is formed in a portion located on the positive electrode conductor pattern, and a second through hole is formed in a portion located on the negative electrode conductor pattern,
the power semiconductor module further comprising:
a first conductor arranged in the first through hole and connected to the at least one snubber circuit; and
a second conductor arranged in the second through hole and connected to the at least one snubber circuit,
the first conductor being connected to the positive electrode conductor pattern,
the second conductor being connected to the negative electrode conductor pattern.

5. The power semiconductor module according to claim 1, wherein
the capacitor and the resistor are formed on a first main surface of the insulating substrate.

6. The power semiconductor module according to claim 1, wherein
the capacitor and the resistor are formed on different surfaces of the insulating substrate.

7. The power semiconductor module according to claim 6, wherein
the resistor is a thick film resistor.

8. The power semiconductor module according to claim 1, wherein
the at least one positive electrode-side power semiconductor element includes first to third positive electrode-side power semiconductor elements,
the at least one negative electrode-side power semiconductor element includes first to third negative electrode-side power semiconductor elements,
the first positive electrode-side power semiconductor element and the first negative electrode-side power semiconductor element are connected in series to form a first leg,
the second positive electrode-side power semiconductor element and the second negative electrode-side power semiconductor element are connected in series to form a second leg, and the third positive electrode-side power semiconductor element and the third negative electrode-side power semiconductor element are connected in series to form a third leg.

9. The power semiconductor module according to claim 8, wherein the at least one snubber circuit includes first to third snubber circuits connected to the first to third legs, respectively.

10. The power semiconductor module according to claim 1, wherein each of the at least one positive electrode-side power semiconductor element and the at least one negative electrode-side power semiconductor element is formed of a wide bandgap semiconductor.

11. The power semiconductor module according to claim 10, wherein the wide bandgap semiconductor is one selected from the group consisting of silicon carbide, gallium nitride, diamond, and gallium oxide.

12. A power conversion device comprising:

a main conversion circuit including the power semiconductor module as recited in claim 1 and configured to convert input electric power and output the converted electric power; and a control circuit configured to output a control signal for controlling the main conversion circuit to the main conversion circuit.

13. The power conversion device according to claim 12, wherein the power conversion device is operated at a voltage change rate of not less than 15 V/ns during switching.

14. The power semiconductor module according to claim 5, wherein the resistor is a thick film resistor.

* * * * *